(12) United States Patent
Nishiwaki

(10) Patent No.: US 7,851,426 B2
(45) Date of Patent: Dec. 14, 2010

(54) CLEANING LIQUID AND CLEANING METHOD USING THE SAME

(75) Inventor: Yoshinori Nishiwaki, Shizuoka-ken (JP)

(73) Assignee: FUJIFILM CORPORATION, Tokyo (JP)

( * ) Notice: Subject to any disclaimer, the term of this patent is extended or adjusted under 35 U.S.C. 154(b) by 592 days.

(21) Appl. No.: 11/898,271

(22) Filed: Sep. 11, 2007

(65) Prior Publication Data

US 2008/0173328 A1 Jul. 24, 2008

(30) Foreign Application Priority Data

Sep. 11, 2006 (JP) ............................. 2006-245735

(51) Int. Cl.
*C11D 7/32* (2006.01)
(52) U.S. Cl. ........................................ 510/175; 134/1.3
(58) Field of Classification Search ................ 510/175; 134/1.3
See application file for complete search history.

(56) References Cited

U.S. PATENT DOCUMENTS

| 7,541,322 B2 * | 6/2009 | Ikemoto et al. ............. 510/175 |
| 2003/0171233 A1 * | 9/2003 | Abe et al. .................... 510/175 |
| 2005/0176606 A1 * | 8/2005 | Konno et al. ................ 510/175 |
| 2007/0232512 A1 * | 10/2007 | Nishiwaki ................... 510/175 |
| 2007/0235061 A1 * | 10/2007 | Mizuta et al. ................ 134/2 |
| 2008/0045016 A1 * | 2/2008 | Andou et al. ............... 438/692 |

FOREIGN PATENT DOCUMENTS

| JP | 2003-289060 A | 10/2003 |
| JP | 2005-260213 A | 9/2005 |

* cited by examiner

*Primary Examiner*—Gregory E Webb
(74) *Attorney, Agent, or Firm*—Sughrue Mion, PLLC

(57) ABSTRACT

A cleaning liquid used in cleaning of a substrate for use in semiconductor devices conducted after chemical mechanical polishing in manufacture of semiconductor devices, comprising a polycarboxylic acid, an anionic surfactant having an aromatic ring structure in a molecule, a polymer compound having an acidic group on a side chain, and a low molecular weight polyethylene glycol, at the cleaning liquid having a pH of 5 or less, as well as a method of cleaning using the same.

11 Claims, No Drawings

CLEANING LIQUID AND CLEANING METHOD USING THE SAME

CROSS-REFERENCE TO RELATED APPLICATION

This application claims priority under 35 USC 119 from Japanese Patent Application No. 2006-245735 the disclosure of which is incorporated by reference herein.

BACKGROUND

1. Technical Field

The present invention relates to a cleaning liquid and a cleaning method using the liquid. More specifically, it relates to a cleaning liquid used in a cleaning step of a substrate for use in semiconductor devices after planarization by chemical mechanical polishing (hereinafter simply referred to as "CMP") in the manufacture of semiconductor devices, and a cleaning method using the cleaning liquid.

2. Related Art

In the development of semiconductor devices typically represented by semiconductor integrated circuits (hereinafter sometimes referred to as "LSI"), generally a shallow trench isolation (STI) film, also referred to as a device isolation film, is often formed first at a lower portion on a substrate, and a multilayer laminate structure, in which layers such as a insulating film or a metal film are laminated in multiple layers, is formed thereabove. When laminating the multilayer, in addition to an interlayer insulating film usually used such as p-TEOS, $O_3$-TEOS, etc., a step of depositing an interlayer insulating film (ILD film) containing, for example, a low insulating constant interlayer film with a specific insulating constant of about 3.5 to 2.0 (including, for example, an organic polymer type, a methyl group-containing silica type, an H—Si containing silica type, an SiOF type, a porous silica type, and a porous organic material type usually referred to simply as Low-k film) or a metal film on a substrate is generally conducted, followed by application of a planarizing treatment by CMP of resultant unevenness and stacking of a new wiring on the planarized surface. In recent years, along with the progress of miniaturization of the size of semiconductor devices, planarization at high accuracy in each of the layers of the substrate has become increasingly necessary.

Therefore, great expectations have been placed on the CMP planarization step (CMP step) and the relative importance of the CMP step as a part of the entire semiconductor device manufacturing process has been increased. Further, a cleaning step of a substrate for a semiconductor device applied after the CMP step also has an important role.

The cleaning step is a step conducted with an aim of removing a targeted amount of polished metals (contaminant metals), a portion of abrasive grains (contaminant particles), and organic residues remaining on the surface of a substrate for use in semiconductor devices after the CMP step. As a cleaning liquid used in the cleaning step, a cleaning liquid containing specific surfactants and alkalis or organic acids (refer, for example, to Japanese Patent Application Laid-Open (JP-A) No. 2003-289060), a cleaning liquid with organic acids, organic alkalis, and surfactants added thereto (refer, for example, to JP-A No. 2005-260213) and the like have been proposed.

However, from the viewpoint of efficiently removing organic residues or fine particles of abrasive grains from the surface of the substrate for use in semiconductor devices after the CMP step, there is still room for improvement. For example, water at high pressure jetted out from a nozzle tip in the cleaning step generates a large amount of mist at the surface of the semiconductor substrate. While most of this is discharged from an exhaust port, a considerable portion thereof is suspended in a chamber and the suspended mist is deposited back onto the substrate surface of the semiconductor device. Such mist often contains dust in the gaseous phase by adsorption, and when the water content of the mist evaporates after deposition, the dust remains adhered to the surface of the semiconductor substrate, which sometimes makes removal thereof difficult. Further, even when mist not containing dust is adsorbed on the surface of the semiconductor substrates and the water evaporates, traces of the mist sometimes remain as a water mark.

Further, for the cleaning step after the CMP step for a device substrate for use in a semiconductor formed with copper wirings, when using an acidic cleaning liquid (hydrochloric acid or hydrofluoric acid) hitherto usually used as a cleaning liquid for a substrate for use in a semiconductor device, not only the copper oxide deposited on the insulating film but also the metallic copper of the wiring are dissolved to cause problems of corrosion or disconnection of the wiring, such that the use of an acidic cleaning liquid is not preferable.

For the removal of organic or inorganic materials as impurities and particles such as abrasive grains, while it has been thought that an alkaline cleaning liquid causing electrostatic repulsion between the wafer surface and the particles is effective, when using a cleaning liquid containing sodium hydroxide, potassium hydroxide or the like, containing metal ions as an alkali source, a problem has resulted that such metals are adsorbed onto the surface of the insulating film (silicon oxide) to deteriorate the insulation properties. Further, among the alkaline cleaning liquids, since an inorganic alkali cleaning liquid not containing metal ions (such as aqueous ammonia) has a strong dissolving effect on copper, it cannot be used in the cleaning of a device substrate for use in semiconductors formed with copper wirings.

On the other hand, while a cleaning liquid containing quaternary ammonium has an advantage of not corroding copper wirings and has high particle removal effect, since quaternary ammonium is strongly alkaline, it has a strong etching effect on the insulating film and has the drawback of roughing the surface of a device substrate for semiconductors planarized in the CMP step. It is known that in order to solve such a problem the etching rate can be retarded by the addition of hydrogen peroxide to the quaternary ammonium. This, however, results in a problem that the oxidization power of the hydrogen peroxide oxidizes the surface of the copper wiring to worsen the conductivity.

As described above, while there is a need for a cleaning liquid used in the cleaning step of a substrate for use in semiconductor devices after the CMP step that do not corrode or oxidize copper wirings when applied to the surface of a semiconductor substrate having copper wirings, and that are capable of removing impurities remaining on the surface of a semiconductor substrate without roughening the surface, such a cleaning liquid has not yet been provided.

SUMMARY

The present invention has been made in view of the above circumstances and provides a cleaning liquid and a method of cleaning using the same.

A first aspect of the present invention provides a cleaning liquid used in cleaning of a substrate for use in semiconductor devices conducted after chemical mechanical polishing in manufacture of semiconductor devices, comprising a polycarboxylic acid, an anionic surfactant having an aromatic ring structure in a molecule, a polymer compound having an acidic group on a side chain, and a low molecular weight polyethylene glycol, at the cleaning liquid having a pH of 5 or less.

DETAILED DESCRIPTION

A cleaning liquid and a method of cleaning using the liquid according to the present invention are to be described in details with reference to specific embodiments.

[Cleaning Liquid]

The cleaning liquid of the invention is used in a cleaning step of a substrate for use in semiconductor devices conducted after a chemical mechanical polishing step in the manufacture of the semiconductor devices and comprising a polycarboxylic acid, an anionic surfactant having an aromatic ring structure in the molecule, a polymer compound having an acidic group on the side chain, and a low molecular weight polyethylene glycol, and at pH of 5 or less.

Each of the components included in the cleaning liquid of the invention is to be described successively.

[(A) Polycarboxylic Acid]

The cleaning liquid of the invention comprises a polycarboxylic acid.

The polycarboxylic acid in the invention includes, dicarboxylic acids such as oxalic acid, malonic acid, and succinic acid, oxypolycarboxylic acids such as tartaric acid, malic acid, and citric acid, and salts thereof. Among the polycarboxylic acids, citric acid, malonic acid, and oxalic acid are preferred and citric acid and oxalic acid are more preferred from the viewpoint of the safety of the material, the cost and the cleaning performance.

In the cleaning liquid of the invention, the polycarboxylic acids may be used alone or two or more of them may be used together at an optional ratio.

The content of the polycarboxylic acid in the cleaning liquid of the invention with respect to the total mass of the cleaning liquid is, preferably, from 0.005 to 30 mass % and, particularly preferably, from 0.01 to 10 mass %.

—Other Organic Acids—

The cleaning liquid of the invention may also comprise organic acids other than the polycarboxylic acids, within a range that does not impair the effects of the invention. Other organic acids mean herein organic compounds other than the polycarboxylic acids, that show an acidity (pH<7) in water and have acidic functional groups such as a carboxyl group, sulfo group, phenolic hydroxyl group, or mercapto group.

[(B) Anionic Surfactant Having an Aromatic Ring Structure in the Molecule]

The cleaning liquid of the invention comprises an anionic surfactant having an aromatic ring structure in the molecule (hereinafter sometimes referred to as "specific anionic surfactant").

The specific anionic surfactant may be those having at least one aromatic ring structure in the molecule and the aromatic ring forming the aromatic ring structure includes, for example, benzene ring, naphthalene ring, anthracene ring, tetracene ring, phenanthrene ring, chrysene ring, and pyrene ring.

Examples of the specific anionic surfactant usable in the invention include, for example, alkylbenzene sulfonic acid and salts thereof, alkylnaphthalene sulfonic acid and salts thereof, alkyldiphenylether sulfonic acid and salts thereof, alkyldiphenylether disulfonic acid and salts thereof, phenol sulfonic acid-formalin condensate and salts thereof, arylphenol sulfonic acid-formalin condensate and salts thereof.

In the specific anionic surfactants set forth above, the alkyl group introduced to the aromatic ring may be either linear or branched type and alkyl groups of 2 to 30 carbon atoms (preferably, 3 to 22) are preferred and includes, for example, propyl group, butyl group, pentyl group, hexyl group, octyl group, nonyl group, decyl group, dodecyl group, hexadecyl group, and octadecyl group. Alkyl group may be either a linear or branched type. Further, in a case where the specific anionic surfactant has a salt structure, examples of the salt structure include sodium salt, potassium salt, ammonium salt, triethanol amine salt, and tetramethyl ammonium salt.

More specific examples of the specific anionic surfactant include, for example, dodecyl benzene sulfonic acid, dodecylphenyl ether disulfonic acid, diphenyl ether disulfonic acid, propyl naphthalene sulfonic acid, triisopropyl naphthalene sulfonic acid, ammonium dodecyl benzene sulfonate and ammonium dodecyl diphenyl ether sulfonate.

Other examples of the specific anionic surfactant usable in the invention include, for example, surfactants having a polyoxyethylene group, a polyoxypropylene group, a fluoroalkyl group, an acetylene group, or a hydroxyl group. More specific examples of them include, for example, polyoxyethylene tristyryl phenyl ether phosphate and phenol sulfonic acid-formalin condensate.

Among the specific anionic surfactants described above, dodecyl benzene sulfonic acid, dodecyl diphenyl ether disulfonic acid, and polyoxyethylene tristyryl phenyl ether phosphate are more preferable.

As the specific anionic surfactant, commercially available products may also be used and, for example, Pelex NBL (sodium alkyl naphthalene sulfonate, manufactured by Kao Co.), Neopelex GS (dodecyl benzene sulfonic acid, manufactured by Kao Co.), Neopelex GS-15 (sodium dodecyl benzene sulfonate, manufactured by Kao Co.), Pelex SS-L (sodium alkyl diphenyl ether disulfonate, manufactured by Kao Co.), and Demol NL (sodium salt of β-naphthalene sulfonic acid-formalin condensate) may also be used suitably.

The specific anionic surfactants may be used alone or two or more of them may be used together at any ratio.

—Other Surfactant—

In the invention, other surfactants than the specific anionic surfactant may also be added within a range that does not impair the effects of the invention.

Other surfactants usable in the invention, those selected from the following group are preferable.

Examples of anionic surfactant include carboxylic acid salt; sulfonic acid salt; sulfuric acid ester salt; and phosphoric acid ester salt. Examples of carboxylic acid salt include soap; N-acylamino acid salt; polyoxyethylene or polyoxypropylene alkyl ether carboxylic acid salt; and acylated peptide. Examples of sulfonic acid salt include alkyl sulfonic acid salt; sulfosuccinic acid salt; α-olefin sulfonic acid salt; and N-acylsulfonic acid salt. Examples of sulfuric acid ester salt include sulfated oil; alkyl sulfate salt; alkyl ether sulfate salt; polyoxyethylene or polyoxypropylene alkyl allylether sulfate salt; and alkylamide sulfate salt. Examples of phosphate ester salt include alkyl phosphate salt; and polyoxyethylene or polyoxypropylene alkyl allyl ether phosphate salt.

Examples of cationic surfactant include aliphatic amine salt; aliphatic quaternary ammonium salt; benzal conium chloride salt; benzethonium chloride; pyridinium salt; and imidazolinium salt. Examples of amphoteric surfactant include carboxybetaine type; sulfobetaine type; aminocarboxylic acid salt; imidazolinium betaine; lecithin; and alkylamine oxide.

Examples of nonionic surfactant include ether type; ether ester type; ester type; and nitrogen-containing type. Examples of the ether type include polyoxyethylene alkyl and alkylphenyl ether; alkylallyl formaldehyde condensated polyoxyethylene ether; polyoxyethylene polyoxypropylene block polymer; and polyoxyethylene polyoxypropylene alkyl ether. Examples of the ether ester type include polyoxyethylene ether of glycerin ester; polyoxyethylene ether of sobitan ester; and polyoxyethylene ether of sorbitol ester. Examples of the ester type include polyethylene glycol fatty acid ester; glycerin ester; polyglycerin ester; sorbitan ester; propylene glycol ester; and sucrose ester. Examples of the nitrogen-containing type include aliphatic acid alkanol amide; polyoxyethylene fatty acid amide; and polyoxyethylene alkyl amide.

In addition, fluoro-type surfactant and silicone type surfactant may be included.

The content of the surfactant in the cleaning liquid of the invention is, preferably, from 0.001 to 10 g, more preferably, from 0.01 to 1 g and, particularly preferably, from 0.02 to 0.5 g as the total amount in one liter of the cleaning liquid.

Further, in a case of using other surfactant together with the specific anionic surfactant, the ratio (mass ratio) of the specific anionic surfactant to other surfactant is, preferably, from 10:90 to 99.5:0.5, more preferably, from 20:80 to 99:1 and, particularly preferably, from 50:50 to 90:10.

[(C) Polymer Compound Having Acidic Group on the Side Chain]

The cleaning liquid of the invention comprises a polymer compound having acidic groups on the side chains (hereinafter sometimes referred to as "specific polymer compound").

Examples of the acidic group present on the side chain of the specific polymer compound include a sulfonic acid group, carboxylic acid group, phosphoric acid group.

The structure of the main chain of the specific polymer compound is not particularly restricted and includes those having an arbitrary structure such as a polyacrylate type structure, polystyrene type structure, polyoxyalkylene type structure or a copolymer structure thereof.

Specific examples of the specific polymer compound include, for example, polyacrylic acid, polystyrene sulfonic acid, formalin condensate of phenol sulfonic acid, and formalin condensate of naphthalene sulfonic acid, but not be limited thereto.

As the specific polymer compound, commercially available products may also be used and include, for example, Poiz 520, Poiz 532A, Homogenol L-18, Homogenol L-1820, and Homogenol L-95 (manufactured by Kao Co.).

The weight average molecular weight (Mw) of the specific polymer compound is, preferably, 100 or more and 1,000,000 or less, more preferably, 200 or more and 500,000 or less and, further preferably, 500 or more and 200,000 or less.

The specific polymer compound may be used alone or two or more of them may be used together at any ratio.

The content of the specific polymer compound in the cleaning liquid of the invention is within a range, preferably, from 0.000001 mass % or more and 5.0 mass % or less, more preferably, 0.00001 mass % or more and 2.0 mass % or less, and, most preferably, 0.0001 mass % or more and 1.0 mass % or less.

[(D) Low Molecular Weight Polyethylene Glycol]

The cleaning liquid of the invention comprises a low molecular weight polyethylene glycol.

In the invention, the low molecular weight polyethylene glycol means a polyethylene glycol having a number average molecular weight within a range from 100 to 20,000.

The low molecular weight polyethylene glycol in the invention is, preferably, a polyethylene glycol having a number average molecular weight of 5,000 or less, from the viewpoint of preventing traces of mist as water marks and surface roughening on the polished substrate.

As the low molecular polyethylene glycol, those also including low molecular weight materials such as diethylene glycol (molecular weight: 106.12) and triethylene glycol (molecular weight: 150.18) having a number average molecular weight within a range from 100 to 5,000, more preferably, from 100 to 2,000 and, further preferably, within a range from 100 to 1,000 are used.

Polyethylene glycols having a number average molecular weight exceeding 5,000 sometimes cause occurrence of water marks when applied to a substrate for use in semiconductor devices having an oxide film such as TEOS on the surface and they are not practical.

The low molecular weight polyethylene glycols may be used alone, or two or more of them may be used in combination.

The content of the low molecular weight polyethylene glycol in the cleaning liquid of the invention is, preferably, from 0.000001 mass % or more and 5.0 mass % or less, more preferably, 0.00001 mass % or more and 2.0 mass % or less and, most preferably, 0.0001 mass % or more and 1.0 mass % or less with respect to the total mass of the cleaning liquid.

[pH]

The pH of the cleaning liquid of the present invention is less than 5. When the pH exceeds 5, metal contaminants cannot be removed to a sufficient degree. In the neutral region of pH from 5 to 9, the sign of the zeta potential is different between the surface of the copper metal and the particle, and the particle tends to be adsorbed easily to the surface of the copper metal and is less easily removed for this reason. In an alkaline region of 9 or more, corrosion occurs on the surface of the copper metal.

Among the above, the pH is, preferably, from 1 to 5 from the viewpoint of preventing corrosion of the surface to be cleaned (surface of the substrate for use in semiconductor devices), and sufficient removal of metal contaminant.

The pH value can be adjusted by the addition of an organic acid.

Further, in the cleaning liquid of the invention, a general pH regulator can also be used but it is preferable not to use such general pH regulator. The pH regulator referred to herein includes, for example, inorganic acids such as nitric acid or sulfuric acid as the acid, and potassium hydroxide or ammonia as the alkali.

The cleaning liquid of the invention is an aqueous solution. That is, those in which the essential components described above are dissolved in an aqueous solvent are preferable. As water used for the solvent, it is preferable to use deionized water or super purified water not containing impurities per se or being decreased with the content thereof as much as possible from the viewpoint of the effect. Further, also from the identical viewpoint, electrolyzed ionic water obtained by electrolysis of water or hydrogen water in which gaseous hydrogen is dissolved in water can also be used.

[Other Component]

In the cleaning liquid of the invention, various compounds can be used together as optional components depending on the purpose in a range that does not impair the effects of the invention in addition to the polycarboxylic acid, the specific anionic surfactant, the specific polymer compound, the low molecular weight polyethylene glycol, and water as the solvent, which are essential components. The optional component usable in the invention includes, for example, chelating agent.

[Chelating Agent]

The cleaning liquid of the invention can also optionally comprise a chelating agent in order to decrease the effect of intruded polyvalent metal ions. As the chelating agent, general-purpose hard water softeners or compounds analogous therewith can be used as precipitation inhibitors for calcium or magnesium and two or more of these may optionally be used in combination. The addition amount of the chelating agent may be an amount sufficient to chelate metal ions such as polyvalent metal ions and is generally about from 5 ppm to 10,000 ppm in the cleaning liquid.

The cleaning liquid of the invention is used suitably to the cleaning of a substrate for use in semiconductors device having a metal or metal compound layer on the surface, or having wiring formed therewith. Since the cleaning liquid of the invention does not cause corrosion or oxidation to the copper wiring, it can be used particularly suitably to the cleaning of a substrate for use in semiconductor devices having copper wirings on the surface.

The substrate for use in semiconductor devices as an object to be cleaned to which the cleaning liquid of the invention is applied is a substrate put to the CMP step in the manufacturing process for the semiconductor devices, and it may be a mono-layer substrate in which a metal wiring is formed on the surface of a substrate material, or a multilayer wiring substrate in which wiring is formed by way of an interlayer insulating film on the surface thereof.

Further, a method of cleaning to which the cleaning liquid of the invention is applied (method of cleaning of the invention) is to be described.

[Method of Cleaning]

The method of cleaning of the invention is conducted subsequent to the chemical mechanical polishing step (CMP step) in the manufacture of semiconductor devices using the cleaning liquid of the invention described previously.

Usually, the CMP step is a step of supplying a polishing liquid to a polishing pad on a polishing level block, bringing the pad into contact with a surface to be polished such as a substrate of a semiconductor device to be polished, and polishing the surface while moving the surface to be polished and the polishing pad relative to each other. The cleaning step conducted subsequently generally adopts a cleaning method of disposing, on a spinner, the substrate for use in the semiconductor device after polishing of the substrate has been completed, supplying a cleaning liquid to the surface to be polished and the rear face thereof at a flow rate of from 100 to 2,000 ml/min and conducting brush scrubbing at room temperature for 10 to 60 sec.

Cleaning can also be applied by using a commercial cleaning tank and, for example, it can also be conducted using a wafer cleaning machine manufactured by MAT Inc. (trade name of ZAB8W2M) to perform scrub-cleaning by contacting a PVA roll brush in a scrubbing station incorporated in the apparatus.

Metals used for a substrate of a semiconductor device to be polished include mainly W or Cu. In recent years, LSI using copper of low wiring resistance has been developed.

Along with refinement of wirings aimed at higher density, it has become necessary to improve the conductivity and electron migration resistance of copper wirings, and a technique capable of providing high productivity, without contaminating materials, at high accuracy and high purity has been needed.

Examples of a step of cleaning a substrate having Cu on the surface and a substrate having a low insulating constant insulating film as an interlayer insulating film and having copper wirings on the surface include, in particular, a cleaning step after conducting CMP (Chemical Mechanical Polishing) of the Cu film, and a cleaning step after opening holes by dry etching in the interlayer insulating film on the wirings. It is particularly important in the cleaning steps to efficiently remove impurity metals or particles present on the surface in order to preserve the purity and the accuracy of the wiring. From the viewpoint described above, the cleaning liquid of the invention is suitably used in the cleaning steps described above. Further, as described above, since the cleaning liquid of the invention causes neither corrosion nor oxidation to the copper wiring, the cleaning liquid of the invention is also suitably used from such a viewpoint.

For confirming the effect of removing the impurities in the cleaning step, it is necessary to detect foreign matter on the wafer. In the invention, a light scattering type foreign matter measurement apparatus (for example, SP1TB1 manufactured by KLA Tencor Co.) is suitably used as an apparatus to detect foreign matter. The apparatus of this type adopts a method of detecting foreign matter on the wafer by having a laser light incident on the wafer surface and measuring the light intensity of the scattered laser light by a photodetector arranged in a predetermined direction, rather than by detecting the normal reflection light of the laser light. While the laser light successively scans the wafer surface, when a non-uniform portion such as foreign matter is present on the wafer surface, the intensity of scattering is altered. In the apparatus, by comparing the intensity of the scattered light with an intensity of scattered light previously calibrated with standard particles, the size and the position of the foreign matter can be obtained by calculating the intensity of the scattered light in terms of standard particles.

According to the method of cleaning using the cleaning liquid of the invention, impurity metals, particles, and the like on the surface of a substrate for use in semiconductor devices after the substrate has been subjected to the CMP step, can be removed efficiently, and this is particularly suitable to the cleaning of a device requiring wirings of high accuracy or a device requiring efficient removal of impurities in each of the respective steps when additionally planarizing a multilayer wiring substrate forming interlayer insulating films and wirings after planarization of a single layer substrate. Further, the method causes neither corrosion nor oxidation of copper wirings when the substrate for use in the semiconductor devices has copper wirings.

Exemplary embodiments of the invention are set to forth below.

<1> A cleaning liquid used in cleaning of a substrate for use in semiconductor devices conducted after chemical mechanical polishing in manufacture of semiconductor devices, comprising a polycarboxylic acid, an anionic surfactant having an aromatic ring structure in a molecule, a polymer compound having an acidic group on a side chain, and a low molecular weight polyethylene glycol, at the cleaning liquid having a pH of 5 or less.

<2> A cleaning liquid according to <1> as described above wherein the polycarboxylic acid is one or more member selected from the group consisting of citric acid, malonic acid and oxalic acid.

<3> The cleaning liquid according to <1> or <2>, wherein the substrate for use in semiconductor devices has copper wiring on the surface.

<4> The cleaning liquid described in any one of <1> to <3> wherein the low molecular weight polyethylene glycol is a polyethylene glycol having a number average molecular weight of 5,000 or less.

<5> A method of cleaning using the cleaning liquid according to any one of <1> to <4>.

EXAMPLES

The present invention is to be described by way of examples. The invention is not restricted to the examples.

| (Preparation of polishing liquid) | |
|---|---|
| Abrasive grains: Colloidal silica (average particle size: 30 nm) | 5 g/L |
| Benzotriazole (BTA) | 1 g/L |
| 30 mass % hydrogen peroxide (oxidant) | 15 g/L |
| Glycin | 10 g/L |

Purified water was added to make the entire amount to 1,000 mL and pH was adjusted to 6.8 by using nitric acid and ammonia.

(Polishing of Cu Wafer)

Apparatus "LGP-613" manufactured by Lapmaster Corp. was used as a polishing apparatus, a film disposed on each wafer was polished while supplying a polishing liquid obtained as described above under the following conditions.
 Substrate: 8 inch silicon wafer with 8 inch copper film
 Number of rotation of table: 50 rpm
 Number of rotation of head: 50 rpm
 Polishing pressure: 168 hPa
 Polishing pad: Product Number IC-1400, manufactured by Rodel Nitta Co.
 Slurry supply speed: 200 ml/min Examples 1 to 14, Comparative Examples 1 to 15

Preparation of Cleaning Liquid

Polycarboxylic acid or organic alkali (Compounds shown in Table 1 or Table 2) (Amount described in Table 1 or Table 2)

Specific anionic surfactant or comparative surfactant (compounds shown in Table 1 or Table 2) (Amount described in Table 1 or Table 2)

Specific polymer compound or comparative polymer compound (compounds shown in Table 1 or Table 2) (Amount described in Table 1 or Table 2)

Low molecular weight polyethylene glycol (those of molecular weight described in Table 1 or Table 2) (Amount described in Table 1 or Table 2)

Purified water was added to make the entire amount to 1000 mL.

(Cleaning Test)

A cleaning test was conducted by using the cleaning liquids of Examples 1 to 14 and Comparative Examples 1 to 15 prepared by the formulations described above and cleaning silicon substrates with a copper film polished under the conditions described above.

Cleaning was conducted by scrub cleaning of contacting a PVA roll brush in a scrubbing station incorporated in a wafer-cleaning machine (ZAB8W2M) manufactured by MAT Inc. Each of the cleaning liquids was mixed and diluted before use with purified water of 20 times by volume, and was passed at 650 ml/min for the upper side and at 500 ml/min for the lower side of the polished substrate for 25 sec and then purified water (deionized water) was passed at 650 ml/min for the upper side and at 500 ml/min for the lower side of the polished substrate for 35 sec and, further, the substrate was treated by a spin dry device incorporated in the apparatus for 30 sec.

<Evaluation for Surface Roughness>

Surface roughness was evaluated by conducting an AFM measurement for Cu wafers cleaned and dried by the cleaning method described above. A Nano-R™ system manufactured by Pacific Nanotechnology Co. was used for the measurement. The measured Ra(nm) is compiled in Table 1 and Table 2, and indicated as A for less than 1.0, B for 1.0 or more and less than 2.0 and C for 2.0 or more. Good evaluation for the surface roughness in this case shows that neither corrosion nor oxidation is caused to the copper wiring.

<Evaluation for Residue of Abrasive Grains>

The number of particles with a size of 0.2 μm or more remaining on the surface of Cu wafers cleaned and dried by the cleaning method described above was measured to evaluate the residue of abrasive grains. For the measurement, SP1-TB1 manufactured by KLA-Tencor Co. was used.

The number of measured defects is indicated in Table 1 and Table 2 as A for 500 or less, B for 501 to 5,000, and C for 5,001 or more.

TABLE 1

| | Polycarboxylic acid or organic alkali | | Specific anionic surfactant or comparative surfactant | | Specific polymer compound or a comparative polymer compound | | Polyethylene glycol | | | Surface roughness | Residual of abrasive grain |
|---|---|---|---|---|---|---|---|---|---|---|---|
| | Type | Additive amount (g/L) | Type | Additive amount (g/L) | Type | Additive amount (g/L) | Molecular weight | Additive amount (g/L) | pH | | |
| Example 1 | Citric acid | 0.50 | Dodecyl diphenyl ether disulfonic acid | 0.010 | POIZ 532A | 0.010 | 1000 | 0.030 | 3.2 | A | A |
| Example 2 | Citric acid | 0.50 | Polyoxyethylene tristylylphenyl ether phosphate | 0.010 | POIZ 532A | 0.010 | 600 | 0.030 | 3.2 | A | A |
| Example 3 | Malonic acid | 0.50 | Dodecyl benzene sulfonic acid | 0.010 | Polystyrene sulfonic acid | 0.010 | 600 | 0.010 | 2.4 | A | A |

TABLE 1-continued

| | Polycarboxylic acid or organic alkali | | Specific anionic surfactant or comparative surfactant | | Specific polymer compound or a comparative polymer compound | | Polyethylene glycol | | | | Residual |
|---|---|---|---|---|---|---|---|---|---|---|---|
| | Type | Additive amount (g/L) | Type | Additive amount (g/L) | Type | Additive amount (g/L) | Molecular weight | Additive amount (g/L) | pH | Surface roughness | of abrasive grain |
| Example 4 | Malonic acid | 0.50 | PELEX NBL | 0.010 | β-naphthalene sulfonic acid - formalin condensate | 0.010 | 300 | 0.010 | 2.4 | A | A |
| Example 5 | Citric acid | 0.50 | Dodecyl diphenyl ether disulfonic acid | 0.100 | POIZ 532A | 0.030 | 150 | 0.050 | 3.1 | A | A |
| Example 6 | Citric acid | 0.50 | Polyoxyethylene tristylylphenyl ether phosphate | 0.010 | POIZ 520 | 0.010 | 150 | 0.010 | 3.1 | A | A |
| Example 7 | Citric acid | 0.50 | Polyoxyethylene tristylylphenyl ether phosphate | 0.010 | β-naphthalene sulfonic acid - formalin condensate | 0.010 | 1000 | 0.050 | 3.1 | A | A |
| Example 8 | Malonic acid | 0.50 | PELEX NBL | 0.200 | β-naphthalene sulfonic acid - formalin condensate | 0.010 | 1000 | 0.010 | 3.1 | A | A |
| Example 9 | Malonic acid | 0.50 | Dodecyl benzene sulfonic acid | 0.200 | POIZ 532A | 0.030 | 300 | 0.030 | 3.1 | A | A |
| Example 10 | Citric acid | 0.50 | PELEX NBL | 0.010 | POIZ 520 | 0.050 | 300 | 0.010 | 3.1 | A | A |
| Example 11 | Oxalic acid | 0.50 | Dodecyl diphenyl ether disulfonic acid | 0.010 | POIZ 520 | 0.030 | 300 | 0.030 | 2.4 | A | A |
| Example 12 | Oxalic acid | 0.50 | Polyoxyethylene tristylylphenyl ether phosphate | 0.010 | β-naphthalene sulfonic acid - formalin condensate | 0.010 | 600 | 0.010 | 2.4 | A | A |
| Example 13 | Oxalic acid | 0.50 | Dodecyl benzene sulfonic acid | 0.010 | Polystyrene sulfonic acid | 0.010 | 600 | 0.010 | 2.4 | A | A |
| Example 14 | Citric acid | 0.50 | PELEX NBL | 0.010 | Polystyrene sulfonic acid | 0.010 | 600 | 0.010 | 3.1 | A | A |

PELEX NBL (sodium alkyl naphthalene sulfonate, manufactured by KAO Corp.)
POIZ 532A (Special polycarboxylic acid polymer surfactant, manufactured by KAO Corp.)
POIZ 520 (Special polycarboxylic acid polymer surfactant, manufactured by KAO Corp.)
Polystyrene sulfonic acid (Molecular weight 75000, by ALDRICH Co.)

TABLE 2

| | Polycarboxylic acid or organic alkali | | Specific anionic surfactant or comparative surfactant | | Specific polymer compound or a comparative polymer compound | | Polyethylene glycol | | | | Residual |
|---|---|---|---|---|---|---|---|---|---|---|---|
| | Type | Additive amount (g/L) | Type | Additive amount (g/L) | Type | Additive amount (g/L) | Molecular weight | Additive amount (g/L) | pH | Surface roughness | of abrasive grain |
| Comp. Example 1 | TMAH | 0.24 | Polyoxyethylene tristylylphenyl ether phosphate | 0.009 | β-naphthalene sulfonic acid - formalin condensate | 0.010 | 300 | 0.010 | 11.5 | A | C |
| Comp. Example 2 | TMAH | 0.48 | PELEX NBL | 0.010 | β-naphthalene sulfonic acid - formalin condensate | 0.010 | 300 | 0.010 | 11.5 | A | B |
| Comp. Example 3 | TEAM | 0.29 | Dodecyl benzene sulfonate | 0.010 | POIZ 520 | 0.010 | 600 | 0.500 | 11.3 | B | A |
| Comp. Example 4 | Citric acid | 0.43 | Lauryl trimethyl ammonium chloride | 0.012 | POIZ 520 | 0.030 | 150 | 0.010 | 3.1 | C | B |
| Comp. Example 5 | Malonic acid | 0.50 | Polyoxyethylene tristylylphenyl ether phosphate | 0.010 | Polyvinyl alcohol (Mw = 10000) | 0.010 | 600 | 0.500 | 3.1 | A | B |
| Comp. Example 6 | Malonic acid | 0.50 | Lauryl trimethyl ammonium chloride | 0.010 | POIZ 520 | 0.010 | 600 | 0.030 | 3.1 | C | B |

TABLE 2-continued

| | Polycarboxylic acid or organic alkali | | Specific anionic surfactant or comparative surfactant | | Specific polymer compound or a comparative polymer compound | | Polyethylene glycol | | | | Residual of abrasive grain |
|---|---|---|---|---|---|---|---|---|---|---|---|
| | Type | Additive amount (g/L) | Type | Additive amount (g/L) | Type | Additive amount (g/L) | Molecular weight | Additive amount (g/L) | pH | Surface roughness | |
| Comp. Example 7 | Citric acid | 0.50 | PELEX NBL | 0.010 | Polyvinyl alcohol (Mw = 10000) | 0.030 | 600 | 0.010 | 3.1 | A | B |
| Comp. Example 8 | Oxalic acid | 0.50 | Lauryl trimethyl ammonium chloride | 0.012 | POIZ 520 | 0.010 | 600 | 0.010 | 2.4 | C | A |
| Comp. Example 9 | Oxalic acid | 0.50 | Dodecyl benzene sulfonate | 0.012 | Polyethylene imine | 0.500 | 600 | 0.010 | 2.4 | C | C |
| Comp. Example 10 | Oxalic acid | 0.76 | Polyoxyethylene tristylylphenyl ether phosphate | 0.010 | POIZ 520 | 0.030 | — | 0.000 | 2.4 | B | A |
| Comp. Example 11 | Citric acid | 0.48 | PELEX NBL | 0.010 | Polyvinyl alcohol (Mw = 10000) | 0.010 | 600 | 0.010 | 3.1 | A | A |
| Comp. Example 12 | Citric acid | 0.48 | PELEX NBL | 0.010 | β-naphthalene sulfonic acid - formalin condensate | 0.010 | 20000 | 0.010 | 3.1 | A | A |
| Comp. Example 13 | Oxalic acid | 0.57 | — | 0.000 | β-naphthalene sulfonic acid - formalin condensate | 0.010 | 150 | 0.010 | 2.4 | C | B |
| Comp. Example 14 | Citric acid | 0.50 | Polyoxyethylene tristylylphenyl ether phosphate | 0.010 | — | 0.000 | 150 | 0.010 | 3.1 | A | B |
| Comp. Example 15 | Citric acid | 0.38 | — | 0.000 | Poiz 532A | 0.010 | 150 | 0.010 | 3.1 | C | A |

TMAH: Tetramethyl ammonium hydroxide;,
TEAH: Tetraethyl ammonium hydroxide
PELEX NBL (sodium alkyl naphthalene sulfonate, manufactured by KAO Corp.)
POIZ 532A (Special polycarboxylic acid polymer surfactant, manufactured by KAO Corp.)
POIZ 520 (Special polycarboxylic acid polymer surfactant, manufactured by KAO Corp.)

From the results of Table 1 and Table 2, it has been found that foreign bodies on Cu wafers after polishing can be removed efficiently causing neither corrosion nor oxidation to the copper wirings by using the cleaning liquids of the examples.

The present invention can provide a cleaning liquid used in a cleaning step of a substrate for use in the semiconductor devices conducted after a chemical mechanical polishing step in the manufacture of the semiconductor devices, and capable of efficiently removing impurities remaining on the surface of a work to be cleaned causing neither corrosion nor oxidation to copper wirings and without causing surface roughness even when applied to the substrate for use in the semiconductor devices having copper wirings, as well as a cleaning method using the cleaning liquid.

All publications, patent applications, and technical standards mentioned in this specification are herein incorporated by reference to the same extent as if each individual publication, patent application, or technical standard was specifically and individually indicated to be incorporated by reference.

What is claimed is:

1. A cleaning liquid used in cleaning of a substrate for use in semiconductor devices conducted after chemical mechanical polishing in manufacture of semiconductor devices, comprising an aqueous solution of: a polycarboxylic acid, an anionic surfactant having an aromatic ring structure in a molecule, a polymer compound having an acidic group on a side chain, and a low molecular weight polyethylene glycol, the cleaning liquid having a pH of 5 or less.

2. The cleaning liquid according to claim 1, wherein the polycarboxylic acid is one or more selected from the group consisting of citric acid, malonic acid and oxalic acid.

3. The cleaning liquid according to claim 1, wherein the content of the polycarboxylic acid is from 0.005 to 30 mass % with respect to the total mass of the cleaning liquid.

4. The cleaning liquid according to claim 1, wherein the substrate for use in semiconductor devices has copper wiring on the surface.

5. The cleaning liquid according to claim 1, wherein the low molecular weight polyethylene glycol is a polyethylene glycol having a number average molecular weight of 5,000 or less.

6. The cleaning liquid according to claim 1, wherein the anionic surfactant having an aromatic ring structure in the molecule is selected from the group consisting of dodecylbenzene sulfonic acid, dodecyldiphenyl ether disulfonic acid, and polyoxyethylene tristyrylphenyl ether phosphate.

7. The cleaning liquid according to claim 1, wherein a main chain structure of the polymer compound having an acidic group on the side chain is one of a polyacrylate structure, a polystyrene structure, a polyoxyalkylene structure and a copolymer structure thereof.

8. A method of cleaning using the cleaning liquid according to claim 1.

9. A method of cleaning a substrate for use in semiconductor devices conducted after chemical mechanical polishing in manufacture of semiconductor devices, the method comprising disposing, on a spinner, a substrate for a semiconductor device after polishing of the substrate has been completed, supplying the cleaning liquid according to claim 1 to at a flow rate of 100 to 2,000 ml/min to a polished surface and a rear surface of the substrate and conducting brush-scrubbing at room temperature for 10 to 60 sec.

10. A method of cleaning using the cleaning liquid according to claim 1 in cleaning after opening holes by dry etching on an interlayer insulating film above wiring, in manufacture of semiconductor devices.

11. The cleaning liquid according to claim 1, wherein the weight average molecular weight of the polymer compound having an acidic group on a side chain is from 500 to 200,000.

* * * * *